(12) United States Patent
Nunomura et al.

(10) Patent No.: US 6,514,658 B2
(45) Date of Patent: *Feb. 4, 2003

(54) PHOTOSENSITIVE POLYMER COMPOSITION, METHOD FOR FORMING RELIEF PATTERNS, AND ELECTRONIC PARTS

(75) Inventors: Masataka Nunomura, Hitachi (JP); Masayuki Ohe, Hitachi (JP)

(73) Assignees: Hitachi Chemical DuPont MicroSystems, Ltd. (JP); Hitachi Chemical DuPont MicroSystems, L.L.C. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/821,038

(22) Filed: Mar. 30, 2001

(65) Prior Publication Data

US 2001/0031419 A1 Oct. 18, 2001

Related U.S. Application Data

(62) Division of application No. 09/432,084, filed on Nov. 1, 1999.

(30) Foreign Application Priority Data

Oct. 30, 1998 (JP) ............................. 10-310521
Mar. 29, 1999 (JP) ............................. 11-086995

(51) Int. Cl.$^7$ ............................. G03F 7/023; G03F 7/30
(52) U.S. Cl. ........................ 430/191; 430/192; 430/193; 430/270.1; 430/326; 430/330; 430/14; 430/18
(58) Field of Search ................................ 430/191, 192, 430/193, 326, 330, 14, 18, 270.1

(56) References Cited

U.S. PATENT DOCUMENTS

| 5,302,489 A | | 4/1994 | Shu |
| 5,753,407 A | | 5/1998 | Oba |
| 6,071,666 A | * | 6/2000 | Hirano et al. ............... 430/191 |

FOREIGN PATENT DOCUMENTS

| DE | 44 06 284 A | 9/1994 |
| EP | 0 459 395 A | 12/1991 |
| EP | 0 478 321 A | 4/1992 |
| EP | 0 957 126 A | 11/1999 |
| JP | 09-127697 A | 5/1997 |
| JP | 10-153854 A | 6/1998 |
| JP | 10-239842 A | 9/1998 |

OTHER PUBLICATIONS

Journal of Applied Polymer Science, 58 (Nov. 28, 1995), No. 9, NY, "Synthesis and Evaluation of Positive–Acting Photosensitive Polyimides with Phenol Moiety", M. Oba et al.

* cited by examiner

Primary Examiner—John S. Chu
(74) Attorney, Agent, or Firm—Griffin & Szipl, P.C.

(57) ABSTRACT

A positive-type, heat-resistant photosensitive polymer composition comprising (a) a polyimide precursor or a polyimide which is soluble in an aqueous alkaline solution, (b) a compound capable of generating an acid when exposed to light, and (c) a compound having a phenolic hydroxyl group; a method of forming a relief pattern comprising a step of applying the composition onto a substrate and drying it thereon, a step of exposing it, a step of developing it, and a step of heating it; and an electronic part having as a surface-protecting film or an interlayer insulating film.

34 Claims, 1 Drawing Sheet

PHOTOSENSITIVE POLYMER COMPOSITION, METHOD FOR FORMING RELIEF PATTERNS, AND ELECTRONIC PARTS

This application is a division of U.S. patent application Ser. No. 09/432,054, filed Nov. 1, 1999, which claims priority based on Japanese Patent Application No. 10-310521, filed Oct. 30, 1998, and Japanese Patent Application No. 11-086995, filed Mar. 29, 1999. The entire disclosures of the above applications are hereby incorporated by reference.

BACKGROUND OF THE INVENTION

1. Field of the Invention

The present invention relates to a photosensitive polymer composition, to a method of using the composition for forming relief patterns, and to electronic parts. More precisely, it relates to a positive-type, heat-resistant photosensitive polymer composition capable of being into a heat-resistant polyimide polymer under heat, which is suitable for surface-protecting films, interlayer insulating films and others for electronic parts such as semiconductor devices, etc., to a method of using the composition for forming relief patterns, and to electronic parts.

2. Description of the Related Art

Polyimides have good heat resistance and good mechanical properties, and are readily formed into films of which the surface could be well planarized. Having those advantages, they are widely used for surface-protecting films, interlayer insulating films and others for semiconductor devices.

Where polyimides are used for surface-protecting films or interlayer insulating films, the step of forming through-holes and the like in those films is achieved essentially in an etching process in which is used a positive-type photo-resist. However, the step comprises applying and removing such a photo-resist, by which the step is complicated. This is the problem with the step. For the purpose of rationalizing the working step, heat-resistant materials with photosensitivity have heretofore been studied.

Relative to photosensitive polyimide compositions, for example, known are (1) a polyimide precursor composition in which is introduced a photosensitive group through ester bonding (JP-B-52-30207, etc.), and (2) a composition as prepared by adding a compound that contains a carbon-carbon double bond capable of being dimerized or polymerized by the action of chemical rays, an amino group and an aromatic bisazide, to a polyamidic acid (JP-B-3-36861, etc.).

In use of such photosensitive polyimide compositions, in general, a solution of the composition is applied onto a substrate, then dried, and exposed to active rays via a mask, and thereafter the non-exposed area is removed with a developer to form a pattern on the substrate.

However, the compositions (1) and (2) noted above are both negative-type ones, and the development for these requires an organic solvent. Therefore, when an etching process of using a positive-type photo-resist is switched to the process of using the negative-type photosensitive polyimide, the problem is that the mask for the exposure device and the development equipment must be changed.

On the other hand, relative to positive-type photosensitive polyimides, for example, known are (3) a polyimide precursor in which is introduced an o-nitrobenzyl group through ester bonding (JP-A-60-37550), and (4) a composition comprising a phenolic hydroxyl group-having polyamidate and an o-quinonediazide compound (JP-A-4-204945).

However, the precursor (3) is essentially sensitive to light having a wavelength of not longer than 300 nm, and its sensitivity is low. Therefore, the precursor (3) is problematic in that an i-line stepper (for single wavelength light of 365 nm) which is much used these days in the art is hardly applicable thereto. On the other hand, the composition (4) is also problematic in that its sensitivity is still unsatisfactory even though higher than the sensitivity of the precursor (3). At present, no one could obtain positive-type photosensitive polyimides having satisfactorily good sensitivity.

SUMMARY OF THE INVENTION

The present invention is to overcome the problems noted above in the related art.

Specifically, the invention provides a positive-type, heat-resistant photosensitive polymer composition, which has high sensitivity and does not take much time for development.

The invention further provides a positive-type. heat-resistant photosensitive polymer composition, which has higher sensitivity or higher resolution, requires shortened development time, or give better patterns.

The invention also provides a method of using the high-sensitivity composition for forming good relief patterns with high resolution.

The invention still provides high-reliability electronic parts having such good relief patterns.

The photosensitive polymer composition of the invention comprises (a) a polyimide precursor or a polyimide which is soluble in an aqueous alkaline solution, (b) a compound capable of generating an acid when exposed to light, and (c) a compound having a phenolic hydroxyl group.

The composition may additionally contain (d) a dissolution retardant for the component (a) in an aqueous alkaline solution.

In the composition, preferably, the component (b) is an o-quinonediazide compound.

Also preferably, the component (a) in the composition is a polyamidate or a polyimide.

Still preferably, the component (a) is a polyamidate having repetitive units of a general formula (I):

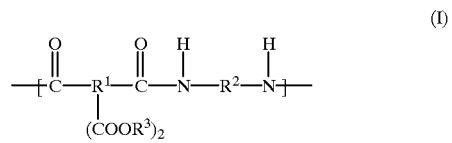

wherein $R^1$ represents a tetravalent organic group; $R^2$ represents a divalent organic group having a carboxyl group or a phenolic hydroxyl group; and two $R^3$'s each independently represent a monovalent organic group.

Still preferably, the component (c) in the composition is a compound of a general formula (II):

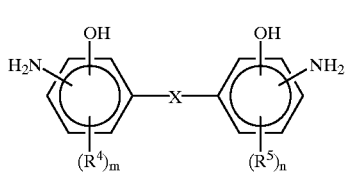

(II)

wherein X represents a single bond or a divalent group; $R^4$ and $R^5$ each independently represent an alkyl group; and m and n each independently represent an integer of from 0 to 3.

Still preferably, X in the compound of formula (II) is selected from the following groups:

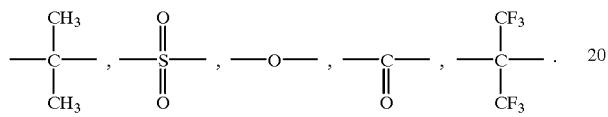

Still preferably, the compound of formula (II) is 2,2-bis(3-amino-4-hydroxyphenyl)hexafluoropropane.

Still preferably, the component (c) is a compound of a general formula (III):

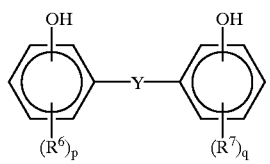

(III)

wherein Y represents a single bond or a divalent group; $R^6$ and $R^7$ each independently represent an alkyl group; and p and q each independently represent an integer of from 0 to 3.

Still preferably, Y in the compound of formula (III) is a divalent organic group having one or more aromatic rings.

Still preferably, the component (c) is a compound having a methylol group and a phenolic hydroxyl group.

Still preferably, the compound having a methylol group and a phenolic hydroxyl group is represented by a general formula (IV):

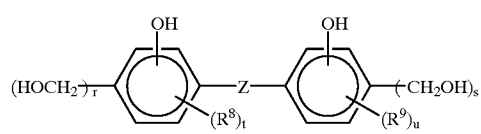

(IV)

wherein Z represents a single bond or a divalent group; $R^8$ and $R^9$ each independently represent an alkyl group or an alkenyl group; r and s each independently represent 1 or 2; and t and u each independently represent an integer of from 0 to 3.

Still preferably, Z in the compound of formula (IV) is a group of:

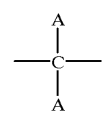

wherein two A's each independently represent a hydrogen atom, or an alkyl group having from 1 to 10 carbon atoms.

Still preferably, the compound of formula (IV) is 3,3'-methylenebis(2-hydroxy-5-methylbenzenemethanol).

Still preferably, the component (d) in the composition is selected from an onium salt, a diaryl compound or a tetraalkylammonium salt.

Still preferably, the component (d) is selected from a diaryliodonium salt, a diaryl sulfone compound, a diarylurea compound or a tetramethylammonium halide compound.

Still preferably, the component (d) is a diaryliodonium salt of a general formula (V):

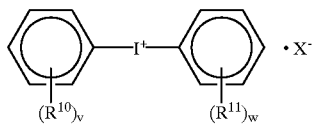

(V)

wherein $R^{10}$ and $R^{11}$ each independently represent a monovalent organic group, and $R^{10}$'s and $R^{11}$'s may be the same or different; v and w each independently represent an integer of from 0 to 5; and $X^-$ represents a counter anion.

Still preferably, the composition contains from 5 to 100 parts by weight of the component (b) and from 1 to 30 parts by weight of the component (c), relative to 100 parts by weight of the component (a).

Still preferably, the composition contains from 0.01 to 15 parts by weight of the component (d) relative to 100 parts by weight of the component (a).

The method of the invention of using the photosensitive polymer composition for forming relief patterns comprises a step of applying the composition onto a substrate and drying it thereon, a step of exposing it, a step of developing it, and a step of heating it.

Preferably, in the method, the light to be used in the exposing step is of i-line.

The electronic part of the invention has the relief pattern as formed in the method noted above, in which the relief pattern acts as a surface-protecting film or an interlayer insulating film.

DESCRIPTION OF THE PREFERRED EMBODIMENTS

Figure 1A:
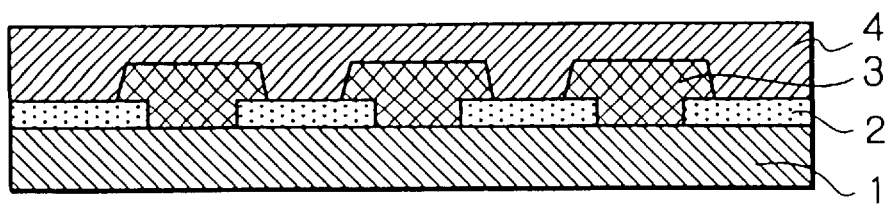
FIG. 1A to FIG. 1E show a process for fabricating a semiconductor device having a multi-layered interconnection structure.

In the photosensitive polymer composition of the invention, the component (a) must be soluble in an aqueous alkaline solution to be used herein as a developer, and is a polymer as selected from polyimide precursors and polyimides that are soluble in an aqueous alkaline solution. Preferably, therefore, the polymer for the component (a) has an acid group in the molecule. The polymer is any of polyimides, or polyimide precursors such as polyamidic acids, polyamidates, polyamidic acid amides, etc., as having good heat resistance and as being favorable to interlayer insulating films or surface-protecting films for semiconductor devices and multi-layered interconnection boards.

As having an acid group or the like, the component (a) is soluble in an aqueous alkaline solution to be used herein as a developer. After having been exposed, the solubility of the exposed area of the film of the polymer composition of the invention is increased due to the change in the component (b) in the composition, whereby the exposed area comes to differ from the non-exposed area in the dissolution rate to give a relief pattern.

The aqueous alkaline solution is an aqueous solution which contains tetramethylammonium hydroxide, a metal hydroxide, an amine or the like as dissolved in water and is alkaline.

The acid group to be in the component (a) includes, for example, a carboxyl group, a phenolic hydroxyl group, a sulfo group, etc. The polymer for use in the invention preferably has a carboxyl group or a phenolic hydroxyl group.

Of polyimide precursors and polyimides having a carboxyl group or a phenolic hydroxyl group for the component (a), preferred are polyamidates and polyimides, as being favorable to lithography. Of those, especially preferred are polyamidates having repetitive units of formula (I) noted above, as their adhesiveness to substrates is good.

In formula (I), the tetravalent organic group represented by $R^1$ is a residue of a tetracarboxylic acid or its dianhydride or derivative capable of reacting with a diamine to form a polyimide precursor structure, and this is preferably a tetravalent aromatic or aliphatic group, more preferably having from 4 to 40 carbon atoms. Even more preferably, $R^1$ is a tetravalent aromatic group having from 6 to 40 carbon atoms. The aromatic group is one containing an aromatic ring (e.g., benzene ring, naphthalene ring, etc.). In the tetravalent aromatic group, preferably, all four bonding sites are on the aromatic ring. The bonding sites are grouped into two pairs, and it is desirable that the two bonding sites of each one pair are positioned in the ortho- or peri-position in the aromatic ring. The two pairs of the bonding sites may be on one and the same aromatic ring, or may be on different aromatic rings as bonded to each other in any desired bonding manner.

In formula (I), the divalent organic group having a carboxyl group or a phenolic hydroxyl group, which is represented by $R^2$, is a residue as derived from a diamine compound having a carboxyl group or a phenolic hydroxyl group by removing the amino groups from the compound, and this is capable of reacting with a tetracarboxylic acid, or with its dianhydride or derivative to form a polyimide precursor structure. The divalent organic group is preferably an aromatic or aliphatic group, more preferably having from 2 to 40 carbon atoms except for the carbon atom in the carboxyl group. Even more preferably, this is an aromatic group in which the number of the carbon atoms falls within the defined range. In the divalent aromatic group, preferably, the two bonding sites are directly on the aromatic ring. In this, the two bonding sites may be on one and the same aromatic ring, or may be on different aromatic rings. It is desirable that the divalent aromatic group has from 1 to 8 carboxyl groups or phenolic hydroxyl groups and that these carboxyl or phenolic hydroxyl groups are also directly on the aromatic ring.

In formula (I), the monovalent organic group represented by $R^3$ is preferably an aliphatic or aromatic hydrocarbon group, more preferably having from 1 to 20 carbon atoms.

The polyimide precursors having the repetitive units of formula (I) may optionally have any other repetitive units in addition to the repetitive units of formula (I). For example, they may have repetitive units of the following general formula (VI):

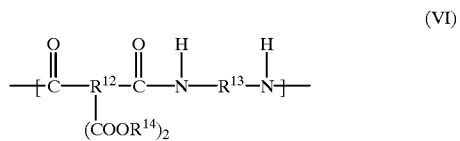

(VI)

wherein $R^{12}$ represents a tetravalent organic group; $R^{13}$ represents a divalent organic group having neither a carboxyl group nor a phenolic hydroxyl group; and $R^{14}$ represents a monovalent organic group.

In formula (VI), for the tetravalent organic group represented by $R^{12}$, referred to are the same as those mentioned hereinabove for $R^1$. Also in formula (VI), for the divalent organic group having neither a carboxyl group nor a phenolic hydroxyl group, which is represented by $R^{13}$, referred to are the same as those mentioned hereinabove for $R^2$ except that the groups for $R^{13}$ shall have neither a carboxyl group nor a phenolic hydroxyl group. Further in formula (VI), the monovalent organic group represented by $R^{14}$, referred to are the same as those mentioned hereinabove for $R^3$.

One repetitive unit of formulae (I) and (VI) has two $R^3$'s and two $R^{14}$'s, respectively. In these formulae, two $R^3$'s and also two $R^{14}$'s may be the same or different ones. In plural repetitive units of these formulae constituting one polyimide precursor, plural $R^1$'s, $R^2$'s, $R^3$'s, $R^{12}$'s, $R^{13}$'s and also $R^{14}$'s may be the same or different ones.

In the polyamidates having repetitive units of formula (I), it is desirable that the ratio of the repetitive units of formula (I) to those of formula (VI) falls between 0.2 and 1, more preferably between 0.4 and 1, in terms of a/(a+b) in which a indicates the number of the repetitive units of formula (I) and b indicates that of the repetitive units of formula (VI). If the ratio is smaller than 0.2, the solubility of the polyamidates in an aqueous alkaline solution may be poor.

The polyamidates having repetitive units of formula (I) may further have still other repetitive units of formula (I) or (VI) in which one or both of the two $R^3$'s or one or both of the two $R^{12}$'s is/are replaced by hydrogen atom(s).

In the polyamidate noted above, it is desirable that the sum total of the repetitive units of formulae (I) and (VI), or that is, the sum total of the repetitive units in which the carboxyl groups in the tetracarboxylic acid residues are completely esterified, falls between 50% and 100%, more preferably between 80% and 100%, even more preferably between 90% and 100%, relative to all repetitive units constituting the polyamidate. One repetitive unit as referred to herein is composed of one acid residue and one amine residue.

Preferably, the polyimide precursor or the polyimide for the component (a) has a weight-average molecular weight of from 3,000 to 200,000, more preferably from 5,000 to 100,000. The molecular weight is measured through gel permeation chromatography, based on the calibration curve of a standard, polystyrene.

In the invention, the polyamidates for the component (a) may be prepared, for example, by reacting a tetracarboxylic acid diester dihalide (e.g., chloride, bromide, etc.) with a diamine compound having a carboxyl group or a phenolic hydroxyl group and optionally with a diamine compound not having a carboxyl group or a phenolic hydroxyl group. In this case, the reaction is preferably effected in the presence of a dehydrohalogenating agent in an organic solvent.

As the tetracarboxylic acid diester dihalide, preferred are tetracarboxylic acid diester dichlorides. The tetracarboxylic acid diester dichlorides may be prepared by reacting a tetracarboxylic acid diester, which is obtained through reaction of a tetracarboxylic acid dianhydride and an alcohol compound, with thionyl chloride.

As the tetracarboxylic acid dianhydride, for example, preferred are aromatic tetracarboxylic acid dianhydrides such as pyromellitic acid dianhydride, 3,3',4,4'-biphenyltetracarboxylic acid dianhydride, 2,3,3',4'-biphenyltetracarboxylic acid dianhydride, 2,2',3,3'-biphenyltetracarboxylic acid dianhydride, 3,3',4,4'-benzophenonetetracarboxylic acid dianhydride, 3,3',4,4'-biphenylether-tetracarboxylic acid dianhydride, 3,3',4,4'-diphenylsulfone-tetracarboxylic acid dianhydride, 1,2,3,4-cyclopentanetetracarboxylic acid dianhydride, 1,2,5,6-naphthalenetetracarboxylic acid dianhydride, 2,3,6,7-naphthalenetetracarboxylic acid dianhydride, 1,4,5,8-naphthalenetetracarboxylic acid dianhydride, 2,3,5,6-pyridine-tetracarboxylic acid dianhydride, 3,4,9,10-perylene-tetracarboxylic acid dianhydride, 3,3',4,4'-diphenylsulfone-tetracarboxylic acid dianhydride, 3,3',4,4'-tetraphenylsilane-tetracarboxylic acid dianhydride, 2,2-bis(3,4-dicarboxyphenyl)hexafluoropropane dianhydride, etc. One or more of these may be used either singly or as combined.

In the polyamidates, alcohol compounds may be used as the starting material for the ester moiety in the side chains. As the alcohol compounds, for example, preferred are alkyl alcohols such as methanol, ethanol, n-propyl alcohol, isopropyl alcohol, n-butyl alcohol, sec-butyl alcohol, tert-butyl alcohol, isobutyl alcohol, 1-pentanol, 2-pentanol, 3-pentanol, isoamyl alcohol, 1-hexanol, 2-hexanol, 3-hexanol, etc.; as well as phenol, benzyl alcohol, etc. One or more of these may be used either singly or as combined.

As other starting materials for the polyamidates, further employed are diamines.

Diamines having an acid group such as a carboxyl group, a phenolic hydroxyl group or the like are indispensable to polyamidates such as those mentioned above and also polyamidic acid amides and polyimides that have no carboxyl group to be derived from tetracarboxylic acids, for the purpose of making the polymers soluble in an aqueous alkaline solution. As the diamines of that type, for example, preferred are aromatic diamine compounds such as 2,5-diaminobenzoic acid, 3,4-diaminobenzoic acid, 3,5-diaminobenzoic acid, 2,5-diaminoterephthalic acid, bis(4-amino-3-carboxyphenyl)methylene, bis(4-amino-3-carboxyphenyl) ether, 4,4'-diamino-3,3'-dicarboxybiphenyl, 4,4'-diamino-5,5'-dicarboxy-2,2'-dimethylbiphenyl, 1,3-diamino-4-hydroxybenzene, 1,3-diamino-5-hydroxybenzene, 3,3'-diamino-4,4'-dihydroxybiphenyl, 4,4'-diamino-3,3'-dihydroxybiphenyl, 2,2-bis(3-amino-4-hydroxyphenyl)propane, bis(4-amino-3-hydroxyphenyl)propane, bis(3-amino-4-hydroxyphenyl) sulfone, bis(4-amino-3-hydroxyphenyl) sulfone, bis(3-amino-4-hydroxyphenyl) ether, bis(4-amino-3-hydroxyphenyl) ether, 2,2-bis(3-amino-4-hydroxyphenyl)hexafluoropropane, 2,2-bis(4-amino-3-hydroxyphenyl)hexafluoropropane, etc. One or more of these may be used either singly or as combined.

As diamines having neither a carboxyl group nor a phenolic hydroxyl group, for example, preferred are aromatic diamine compounds such as 4,4'-diaminodiphenyl ether, 4,4'-diaminodiphenylmethane, 4,4'-diaminodiphenyl sulfone, 4,4'-diaminodiphenyl sulfide, benzidine, m-phenylenediamine, p-phenylenediamine, 1,5-naphthalenediamine, 2,6-naphthalenediamine, bis(4-aminophenoxyphenyl) sulfone, bis(3-aminophenoxyphenyl) sulfone, bis(4-aminophenoxy)biphenyl, bis[4-(4-aminophenoxy)phenyl] ether, 1,4-bis(4-aminophenoxy)benzene, 4,4'-diamino-2,2'-dimethylbiphenyl, etc. One or more of these maybe used either singly or as combined.

As still other diamines which are for improving the heat resistance of the polymers, optionally employable herein are diamine compounds having a sulfonamido group or a carboxamido group, for example, 4,4'-diaminodiphenylether-3-sulfonamide, 3,4'-diaminodiphenylether-4-sulfonamide, 3,4'-diaminodiphenylether-3'-sulfonamide, 3,3'-diaminodiphenylether-4-sulfonamide, 4,4'-diaminodiphenylether-3-carboxamide, 3,4'-diaminodiphenylether-4-carboxamide, 3,4'-diaminodiphenylether-3'-carboxamide, 3,3'-diaminodiphenylether-4-carboxamide, etc. One or more of these may be used, while combined with the diamines noted above. If combined, it is desirable that the amount of the additional diamine is at most 15 mol %, more preferably at most 10 mol % of the total amount of all diamine compounds used.

In producing the polyamidates for use in the invention, tetracarboxylic acid diesters are prepared. One method of preparing the tetracarboxylic acid diesters comprises, for example, mixing a tetracarboxylic acid dianhydride such as that mentioned above and an alcohol compound such as that mentioned above, in an organic solvent in the presence of a base.

In that method, the ratio (by mol) of the tetracarboxylic acid dianhydride to the alcohol compound preferably falls between 1/2 and 1/2.5, as the ratio of the former/the latter, but is most preferably 1/2. The ratio (by mol) of the tetracarboxylic acid dianhydride to the base preferably falls between 1/0.001 and 1/3, more preferably between 1/0.005 and 1/2, as the ratio of the former/the latter. The reaction temperature preferably falls between 10 and 60° C., and the reaction time preferably falls between 3 and 24 hours.

The method of producing tetracarboxylic acid diester dichlorides is known. For example, thionyl chloride is dropwise added to and reacted with a tetracarboxylic acid diester as dissolved in an organic solvent to obtain them. In this reaction, the ratio (by mol) of the tetracarboxylic acid diester to the thionyl chloride preferably falls between 1/1.1 and 1/2.5, as the ratio of the former/the latter, but more preferably between 1/1.5 and 1/2.2. The reaction temperature preferably falls between −20 and 40° C., and the reaction time preferably falls between 1 and 10 hours.

The polyamidates may be prepared, for example, as follows: A diamine compound such as that mentioned above, and a dehydrohalogenating agent such as pyridine or the like are dissolved in an organic solvent, then a tetracarboxylic acid diester dihalide as dissolved in an organic solvent is added to and reacted with this, and thereafter the resulting reaction mixture is poured into a bad solvent such as water or the like. The precipitate thus formed is taken out through filtration and dried to obtain the intended product, polyamidate. In this process, the ratio (by mol) of the total amount of the diamine compound to the tetracarboxylic acid diester dihalide preferably falls between 0.6/1 and 1/0.6, as the ratio of the former/the latter, but more preferably between 0.7/1 and 1/0.7. he reaction temperature preferably falls between −20 and 40° C., and the reaction time preferably falls between 1 and 10 hours. The ratio (by mol) of the dehydrohalogenating agent to the tetracarboxylic acid diester dihalide preferably falls between 1.8/1 and 2.2/1, as the ratio of the former/the latter, but more preferably between 1.9/1 and 2.1/1.

In the production of the polyamidates, where the additional diamine compound not having any acid group such as a carboxyl group, a phenolic hydroxyl group or the like is used, the ratio of the diamine compound having an acid group to the additional diamine compound not having an acid group is preferably such that the amount of the former falls between 20 and 100 mol % while the amount of the latter falls between 0 and 80 mol %. In this, the total amount of the diamine compounds used shall be 100 mol %. More preferably, the amount of the former falls between 40 and 100 molt while the amount of the latter falls between 0 and 60 molt, and the total amount of the diamine compounds used shall be 100 mol %. The former diamine compound having an acid group is for making the resulting polyamidates soluble in an aqueous alkaline solution. If its amount is smaller than 20 mol %, the sensitivity of the composition containing the polymer may be low, and the developing time for the composition may be long.

Polyamidates having an acid group for use in the invention are described in detail hereinabove. For producing polyamidic acids which are also usable herein as the component (a), it is not always necessary to use diamine compounds having an acid group such as a carboxyl group, a phenolic hydroxyl group or the like. This is because polyamidic acids have carboxyl groups that are the residues of tetracarboxylic acids used for producing them. Polyamidic acids may be prepared through direct reaction of a tetracarboxylic acid dianhydride and a diamine such as those mentioned above, in an organic solvent.

Also usable herein are polyamidates not having an acid group in the diamine residue, in which a part of the ester moiety shall have a free carboxyl group. Polyamidates of that type may be prepared through reaction of a tetracarboxylic acid dianhydride, a tetracarboxylic diester dihalide and a diamine such as those mentioned above.

For producing polyamidic acid amides and polyimides for use in the invention, generally used are diamine compounds having an acid group such as a carboxyl group, a phenolic hydroxyl group or the like in order that the polyamidic acid amides and polyimides produced could be soluble in an aqueous alkaline solution. For the ratio of the diamine compound to any other diamine compound not having an acid group such as a carboxyl group, a phenolic hydroxyl group or the like in producing them, referred to is the same as that mentioned hereinabove in the case of producing polyamidates.

Briefly, polyamidic acid amides may be produced in the same manner as in the case of producing polyamidates mentioned hereinabove, except that monoamine compounds are used in place of alcohol compounds. The monoamine compounds include, for example, methylamine, ethylamine, n-propylamine, isopropylamine, n-butylamine, sec-butylamine, tert-butylamine, isobutylamine, 1-pentylamine, 2-pentylamine, 3-pentylamine, isoamylamine, 1-hexylamine, 2-hexylamine, 3-hexylamine, morpholine, aniline, benzylamine, etc.

Polyimides may be produced from those polyamidic acids through dehydrating ring closure.

The compound capable of generating an acid when exposed to light, which is used as the component (b) in the invention, is a photosensitive agent. When exposed to light, this generates an acid, thereby increasing the solubility of the exposed area of the polymer composition in an aqueous alkaline solution. The compound is not specifically defined, including, for example, o-quinonediazide compounds, aryldiazonium salts, diaryliodonium salts, triarylsulfonium salts, etc. Preferred are o-quinonediazide compounds as having high sensitivity.

O-quinonediazide compounds have a site capable of being converted into a carboxylic acid when exposed to light. They are produced, for example, through condensation of an o-quinonediazidosulfonyl chloride with a hydroxy compound and/or an amino compound in the presence of a dehydrochlorinating agent.

The o-quinonediazidosulfonyl chlorides include, for example, 1,2-benzoquinone-2-diazido-4-sulfonyl chloride, 1,2-naphthoquinone-2-diazido-5-sulfonyl chloride, 1,2-naphthoquinone-2-diazido-4-sulfonyl chloride, etc.

The hydroxy compounds include, for example, hydroquinone, resorcinol, pyrogallol, bisphenol A, bis(4-hydroxyphenyl)methane, 2,2-bis(4-hydroxyphenyl) hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl) methane, 2,2-bis(2,3,4-trihydroxyphenyl)propane, 4b,5,9b, 10-tetrahydro-1,3,6,8-tetrahydroxy-5,10-dimethylindeno[2, 1-a]indene, tris(4-hydroxyphenyl)methane, 1,1,1- or 1,1,2-tris(4-hydroxyphenyl)ethane, etc.

The amino compounds include, for example, p-phenylenediamine, m-phenylenediamine, 4,4'-diaminodiphenyl ether, 4,4'-diaminodiphenylmethane, 4,4'-diaminodiphenyl sulfone, 4,4'-diaminodiphenyl sulfide, o-aminophenol, m-aminophenol, p-aminophenol, 3,3'-diamino-4,4'-dihydroxybiphenyl, 4,4'-diamino-3,3'-dihydroxybiphenyl, 2,2-bis(3-amino-4-hydroxyphenyl) propane, 2,2-bis(4-amino-3-hydroxyphenyl)propane, bis(3-amino-4-hydroxyphenyl) sulfone, bis(4-amino-3-hydroxyphenyl) sulfone, 2,2-bis(3-amino-4-hydroxyphenyl) hexafluoropropane, 2,2-bis(4-amino-3-hydroxyphenyl) hexafluoropropane, etc.

For their condensation, it is desirable that the o-quinonediazidosulfonyl chloride and the hydroxy compound and/or the amino compound are so controlled that the sum total of the hydroxy group and the amino group is from 0.5 to 1.2 equivalent relative to one mol of the o-quinonediazidosulfonyl chloride. Preferably, the ratio of the dehydrochlorinating agent to the o-quinonediazidosulfonyl chloride falls between 0.95/1 and 1/0.95.

Also preferably, the reaction temperature falls between 0 and 40° C., and the reaction time falls between 1 and 10 hours.

As the reaction solvent, usable is any of dioxane, acetone, methyl ethyl ketone, tetrahydrofuran, diethyl ether, N-methylpyrrolidone, etc.

The dehydrochlorinating agent includes, for example, sodium carbonate, sodium hydroxide, sodium hydrogencarbonate, potassium carbonate, potassium hydroxide, trimethylamine, triethylamine, pyridine, etc.

In the photosensitive polymer composition of the invention, the amount of the component (b) preferably falls between 5 and 100 parts by weight, more preferably between 8 and 40 parts by weight, relative to 100 parts by weight of the component (a), in view of the dissolution rate difference between the exposed area and the non-exposed area of the film of the composition, and of the latitude in the sensitivity of the composition.

The component (c) to be in the composition of the invention is a compound having a phenolic hydroxyl group. Adding the component (c) to the polymer composition increases the dissolution rate of the exposed area of the film of the composition being developed with an aqueous alkaline solution, thereby increasing the sensitivity of the composition. The component (c) does not include the polyimides and the polyimide precursors that serve as the component (a).

The component (c), if having a large molecular weight, will retard its effect of promoting the dissolution of the exposed area of the film of the composition. In general, therefore, compounds having a molecular weight of at most 1,500, more preferably at most 1,000 are preferred for the component (c). The component (c) preferably has a molecular weight of at least 100.

Preferred examples of the compound having a phenolic hydroxyl group for the component (c) are compounds of the following general formula (II) having an amino group and a phenolic hydroxyl group, compounds of the following general formula (III), and compounds of the following general formula (IV) having a methylol group and a phenolic hydroxyl group.

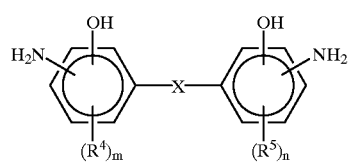
(II)

wherein X represents a single bond or a divalent group; $R^4$ and $R^5$ each independently represent an alkyl group; and m and n each independently represent an integer of from 0 to 3.

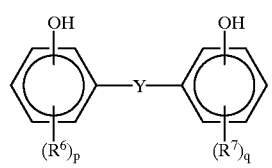
(III)

wherein Y represents a single bond or a divalent group; $R^6$ and $R^7$ each independently represent an alkyl group; and p and q each independently represent an integer of from 0 to 3.

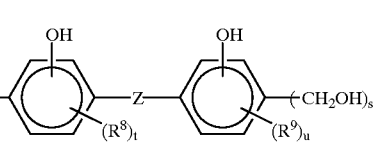
(IV)

wherein Z represents a single bond or a divalent group; $R^8$ and $R^9$ each independently represent an alkyl group or an alkenyl group; r and s each independently represent 1 or 2; and t and u each independently represent an integer of from 0 to 3.

Of compounds having a phenolic hydroxyl group, those of formula (II) are preferred, as the composition comprising any of them has a high degree of resolution. In formula (II), the divalent group of X includes, for example, an alkylene group having from 1 to 10 carbon atoms such as a methylene group, an ethylene group, a propylene group, etc.; an alkylidene group having from 2 to 10 carbon atoms such as an ethylidene group, a 2,2-propylidene group, etc.; an arylene group having from 6 to 30 carbon atoms such as a phenylene group, etc.; those hydrocarbon groups where hydrogen atoms are all or partly substituted with a halogen atom such as a fluorine atom, etc.; a sulfone group, a carbonyl group, an ether bond, a thioether bond, an amido bond and the like, and also includes a divalent organic group of a general formula:

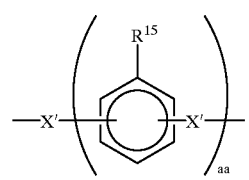

wherein X' is selected from a single bond, an alkylene group (for example, having from 1 to 10 carbon atoms), an alkylidene group (for example, having from 2 to 10 carbon atoms), those groups where hydrogen atoms are all or partly substituted with a halogen atom, and also from a sulfone group, a carbonyl group, an ether bond, a thioether bond, an amido bond and the like, and plural X's, if any, may be the same or different; $R^{15}$ represents a hydrogen atom, a hydroxyl group, an alkyl group, or a halogenoalkyl group, and plural $R^{15}$'s, if any, may be the same or different; and aa falls between 1 and 10. In formula (II), the alkyl group for $R^4$ and $R^5$ may have, for example, from 1 to 10 carbon atoms, including, for example, a methyl group, an ethyl group, etc.

Of compounds of formula (II), preferred are those where X is selected from the following groups:

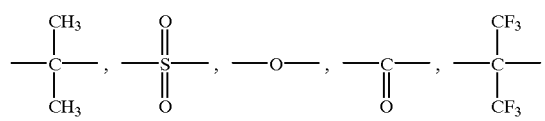

as the composition comprising any of them has a high degree of resolution.

Specific examples of the compounds of formula (II) include 3,3'-diamino-4,4'-dihydroxybiphenyl, 4,4'-diamino-3,3'-dihydroxybiphenyl, 2,2-bis(3-amino-4-hydroxyphenyl)propane, 2,2-bis(4-amino-3-hydroxyphenyl)propane, bis(3-amino-4-hydroxyphenyl) sulfone, bis(4-amino-3-hydroxyphenyl) sulfone, bis(3-amino-4-hydroxyphenyl) ether, bis(4-amino-3-hydroxyphenyl) ether, 2,2-bis(3-amino-4-hydroxyphenyl)hexafluoropropane, 2,2-bis(4-amino-3-hydroxyphenyl)hexafluoropropane,

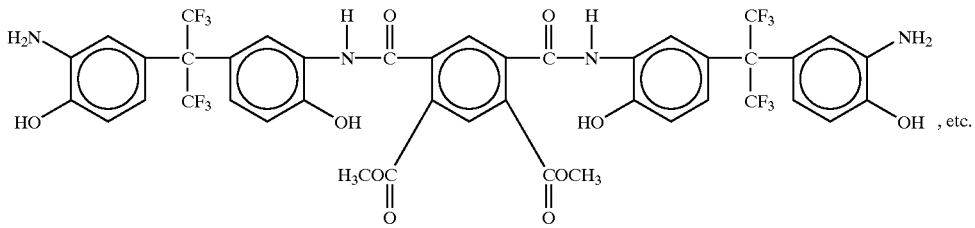
, etc.

Of those, especially preferred is 2,2-bis(3-amino-4-hydroxyphenyl)hexafluoropropane, as its capabilities to increase the sensitivity and the resolution of the composition comprising it are good.

Compounds of formula (III) are also preferred, as well improving the resolution of the composition comprising any of them. In formula (III), the divalent group of Y includes, for example, an alkylene group having from 1 to 10 carbon atoms such as a methylene group, an ethylene group, a propylene group, etc.; an alkylidene group having from 2 to 10 carbon atoms such as an ethylidene group, etc.; an arylene group having from 6 to 30 carbon atoms such as a phenylene group, etc.; those hydrocarbon groups where hydrogen atoms are all or partly substituted with a halogen atom such as a fluorine atom, etc.; a sulfone group, a carbonyl group, an ether bond, a thioether bond, an amido bond and the like, and also includes a divalent organic group of a general formula:

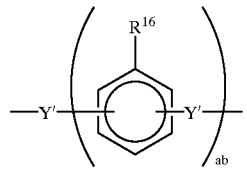

wherein Y' is selected from a single bond, an alkylene group (for example, having from 1 to 10 carbon atoms), an alkylidene group (for example, having from 2 to 10 carbon atoms), those groups where hydrogen atoms are all or partly substituted with a halogen atom, and also from a sulfone group, a carbonyl group, an ether bond, a thioether bond, an amido bond and the like, and plural Y's, if any, may be the same or different; $R^{16}$ represents a hydrogen atom, a hydroxyl group, an alkyl group, or a halogenoalkyl group, and plural $R^{16}$'s, if any, may be the same or different; and ab falls between 1 and 10. Y in formula (III) further includes a divalent organic group of a general formula:

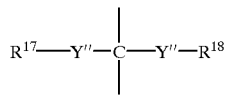

wherein Y" is selected from a single bond, an alkylene group (for example, having from 1 to 10 carbon atoms), an alkylidene group (for example, having from 2 to 10 carbon atoms), those groups where hydrogen atoms are all or partly substituted with a halogen atom, and also from a sulfone group, a carbonyl group, an ether bond, a thioether bond, an amido bond and the like, and the two Y"'s may be the same or different; $R^{17}$ and $R^{18}$ each independently represents a hydrogen atom, or a monovalent organic group. The monovalent organic group for $R^{17}$ and $R^{18}$ includes, for example, an alkyl group (for example, having from 1 to 10 carbon atoms), an aryl group (for example, having from 6 to 20 carbon atoms), a hydroxyaryl group (for example, having from 6 to 20 carbon atoms), etc.

Of those groups, a divalent organic group having one or more aromatic rings is preferred for Y.

Specific examples of the compounds of formula (III) include biphenol, bisphenol A, bisphenol F, bis(2-hydroxy-5-methylphenyl)methane, 4,4'-dihydroxybenzophenone, tris(4-hydroxyphenyl)methane, 2,4',4"-methylidenetrisphenol, 1,1,1- or 1,1,2-tris(4-hydroxyphenyl)ethane, 1,1,1- or 1,1,2-tris(4-hydroxy-2-methylphenyl)ethane, 2,6-bis[(2-hydroxy-5-methylphenyl)methyl]-4-methylphenol, 4,4',4",4'''-(1,2-ethanediylidene)tetrakisphenol, 2,2'-methylenebis[6-[(2-hydroxy-5-methylphenyl)methyl]-4-methylphenol], etc.

For the component (c) for use in the invention, also preferred are compounds having a methylol group and a phenolic hydroxyl group, as they increase the dissolution rate of the exposed area of the film of the composition being developed with an aqueous alkaline solution, and prevent the patterned film being cured from being fused away. For the compounds having a methylol group and a phenolic hydroxyl group, preferred are those of formula (IV) mentioned above, as their capabilities are good.

In formula (IV), the divalent group of Z includes, for example, an alkylene group having from 1 to 10 carbon atoms such as a methylene group, an ethylene group, a propylene group, etc.; an alkylidene group having from 2 to 10 carbon atoms such as an ethylidene group, etc.; an arylene group having from 6 to 30 carbon atoms such as a phenylene group, etc.; those hydrocarbon groups where hydrogen atoms are all or partly substituted with a halogen atom such as a fluorine atom, etc.; a sulfone group, a carbonyl group, an ether bond, a thioether bond, an amido bond and the like, and also includes a divalent organic group of a general formula:

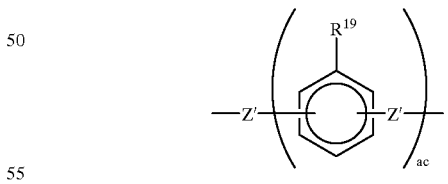

wherein Z' is selected from a single bond, an alkylene group (for example, having from 1 to 10 carbon atoms), an alkylidene group (for example, having from 2 to 10 carbon atoms), those groups where hydrogen atoms are all or partly substituted with a halogen atom, and also from a sulfone group, a carbonyl group, an ether bond, a thioether bond, an amido bond and the like, and plural Z's, if any, may be the same or different; $R^{19}$ represents a hydrogen atom, a hydroxyl group, an alkyl group, or a halogenoalkyl group, and plural $R^{19}$'s, if any, may be the same or different; and ac falls between 1 and 10.

Of compounds of formula (IV), preferred are those where Z represents a group of:

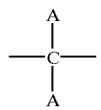

(V)

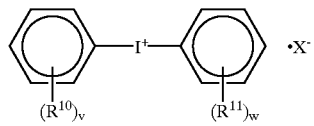

wherein two A's each independently represent a hydrogen atom, or an alkyl group having from 1 to 10 carbon atoms, as their capabilities are good.

Specific examples of the compounds of formula (IV) include 3,3'-methylenebis(2-hydroxy-5-methylbenzenemethanol), 4,4'-(1-methylethylidene)bis[2-methyl-6-hydroxymethylphenol], 3,3',5,5'-tetrakis (hydroxymethyl)[(1,1'-biphenyl)-4,4'-diol], 4,4'-(1-methylethylidene)bis[2,6-bis(hydroxymethyl)phenol], 2,2'-methylenebis(4,6-bishydroxymethylphenol), 2,6-bis[(2-hydroxy-3-hydroxymethyl-5-methylphenyl)methyl]-4-methylphenol, etc.

Of those, most preferred is 3,3'-methylenebis(2-hydroxy-5-methylbenzenemethanol), as being the most effective.

In the photosensitive polymer composition of the invention, the amount of the component (c) preferably falls between 1 and 30 parts by weight, more preferably between 5 and 20 parts by weight, relative to 100 parts by weight of the component (a), in view of the development time for the composition and of the latitude in the film retentiveness in the non-exposed area.

Preferably, the composition of the invention additionally contains, along with the component (c) noted above, a dissolution retardant for the component (a) in an aqueous alkaline solution, as an optional component (d). The dissolution retardant is a compound effective for retarding the dissolution of the component (a) in an aqueous alkaline solution. As combined with the component (c), the component (d) acts to lower the dissolution rate of the non-exposed area when the exposed film of the composition is developed with an aqueous alkaline solution, whereby the solubility difference between the exposed area and the non-exposed area is increased to give better patterns.

As the component (d), preferred are onium salts, diaryl compounds and tetraalkylammonium salts. The onium salts include, for example, iodonium salts such as diaryliodonium salts, etc.; sulfonium salts such as triarylsulfonium salts, etc.; phosphonium salts; diazonium salts such as aryldiazonium salts, etc. The diaryl compounds include, for example, those having two aryl groups as bonded to each other via a bonding group therebetween, such as diaryl sulfones, diaryl ketones, diaryl ethers, diarylpropanes, diarylhexafluoropropanes, diarylurea compounds, etc. The tetraalkylammonium salts include, for example, tetraalkylammonium halides in which the alkyl group may be a methyl group, an ethyl group or the like.

Of those, the dissolution-retarding effect of diaryliodonium salts, diaryl sulfone compounds, diarylurea compounds and tetramethylammonium halide compounds is good. For example, the diaryliodonim salts include diphenyliodonium salts and their derivatives; the diarylurea compounds include diphenylurea, dimethyldiphenylurea, etc.; the diaryl sulfone compounds include diphenyl sulfone, dimethyldiphenyl sulfone, etc.; the tetramethylammonium halide compounds include tetramethylammonium chloride, tetramethylammonium bromide, tetramethylammonium iodide, etc.

Above all, preferred are diaryliodonium salts of the following general formula (V):

wherein $R^{10}$ and $R^{11}$ each independently represent a monovalent organic group (preferably having from 1 to 20 carbon atoms), for example, an alkyl group such as a methyl group, an ethyl group, a propyl group or the like, or an alkoxy group such as a methoxy group, an ethoxy group, a propoxy group or the like, or an aryl group such as a phenyl group or the like, and $R^{10}$'s and $R^{11}$'s may be the same or different; v and w each independently represent an integer of from 0 to 5; and $X^-$ represents a counter anion. Preferred examples of the counter anion include nitrato ions, sulfonato ions, iodide ions, borato ions, etc.

Specific examples of the compounds of formula (V) include diphenyliodonium nitrate, diphenyliodonium trifluoromethanesulfonate, diphenyliodonium nanofluorobutanesulfonate, diphenyliodonium toluenesulfonate, diphenyliodonim chloride, diphenyliodonium bromide, diphenyliodonium iodide, diphenyliodonium hexafluorophosphate, diphenyliodonium 9,10-dimethoxyanthracene-2-sulfonate, diphenyliodonium 8-anilinonaphthalene-1-sulfonate, 4-methoxydiphenyliodonium nitrate, 4-methoxydiphenyliodonium trifluoromethanesulfonate, 4,4'-di-t-butyldiphenyliodonium trifluoromethanesulfonate, etc.

In the photosensitive polymer composition of the invention, the amount of the component (d) preferably falls between 0.01 and 15 parts by weight, more preferably between 0.05 and 10 parts by weight, relative to 100 parts by weight of the component (a), in view of the sensitivity of the composition and of the latitude in the development time for the composition.

The photosensitive polymer composition of the invention may be prepared by dissolving the components (a), (b) and (c) and optionally the component (d) and any other optional components in a solvent.

As the solvent, for example, preferred is an aprotic polar solvent such as N-methyl-2-pyrrolidone, N,N-dimethylformamide, N,N-dimethylacetamide, dimethylsulfoxide, hexamethylphosphoramide, tetramethylene sulfone, γ-butyrolactone, etc. One or more of these may be used either singly or as combined.

For the purpose of improving the coatability of the composition, any other solvent, such as diethyl ketone, diisobutyl ketone, methyl amyl ketone, ethyl lactate, propylene glycol monomethyl ether acetate or the like, may be combined with the solvent noted above.

If desired, the photosensitive polymer composition of the invention may optionally contain, as an adhesiveness promoter, any of organic silane compounds, aluminium chelate compounds and polyamidic acids having repetitive units of the following general formula (VII):

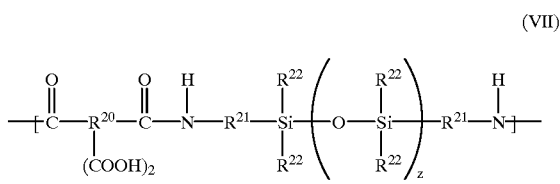

(VII)

wherein $R^{20}$ represents a tetravalent organic group; $R^{21}$ represents a divalent organic group; $R^{22}$ represents a monovalent organic group; and z represents an integer of 1 or more.

The organic silane compounds include, for example, γ-aminopropyltrimethoxysilane, γ-aminopropyltriethoxysilane, vinyltriethoxysilane, γ-glycidoxypropyltriethoxysilane, γ-methacryloxypropyltrimethoxysilane, ureidopropyltriethoxysilane, etc.

The aluminium chelate compounds include, for example, tris(acetylacetonato)aluminium, acetylacetatoaluminium diisopropylate, etc.

In the polyamidic acids having the siloxane structure that comprises the repetitive units of formula (VII), the tetravalent organic group represented by $R^{20}$ is a residue of a tetracarboxylic acid dianhydride that may be the starting compound for polyimides, and it is preferably a tetravalent aromatic or aliphatic group, more preferably having from 4 to 40 carbon atoms. Even more preferably, it is a tetravalent aromatic group having from 6 to 40 carbon atoms. It is desirable that, in the tetravalent aromatic group, the four bonding sites are all on the aromatic ring. The bonding sites are grouped into two pairs, and it is desirable that the two bonding sites of each one pair are positioned in the ortho- or peri-position in the aromatic ring. The two pairs of the bonding sites may be on one and the same aromatic ring, or may be on different aromatic rings as bonded to each other in any desired bonding manner.

In formula (VII), the part as sandwiched between the two $R^{21}$'s is a residue of a siliconediamine compound from which the amino groups are removed, and it is desirable that this part has from 6 to 40 carbon atoms in all. The divalent organic group represented by $R^2$ preferably has from 1 to 10 carbon atoms, including, for example, an alkylene group, a phenylene group or the like in which the number of carbon atoms falls within the preferred range as above. Those two $R^{21}$'s may be the same or different. The monovalent organic group represented by $R^{22}$ preferably has from 1 to 6 carbon atoms, including, for example, an alkyl group or a phenyl group in which the number of carbon atoms falls within the preferred range as above.

In the composition of the invention, the amount of the adhesiveness promoter, if any, preferably falls between 0.1 and 20 parts by weight, more preferably between 0.5 and 10 parts by weight, relative to 100 parts by weight of the component (a).

The photosensitive polymer composition of the invention may be formed into polyimide relief patterns in a process comprising a step of applying the composition onto a substrate and drying it thereon, a step of exposing it, a step of developing it and a step of heating it.

In the coating and drying step, the photosensitive polymer composition is applied onto a substrate of, for example, glass, semiconductors, metal oxide insulators (e.g., $TiO_2$, $SiO_2$, etc.), silicon nitride or the like, through spin coating with a spinner or the like, and then dried thereon, for example, on a hot plate or in an oven or the like.

In the next exposing step, the film of the photosensitive polymer composition formed on the substrate is exposed to active rays, such as ultraviolet rays, visible rays, radiations or the like, via a mask. Especially preferably, it is exposed to i-line (a single wavelength light of 365 nm), as being able to be patterned at high resolution.

In the next developing step, the exposed area is removed with a developer to form a pattern on the substrate. As preferred examples of the developer, mentioned are aqueous alkaline solutions of, for example, sodium hydroxide, potassium hydroxide, sodium silicate, ammonia, ethylamine, diethylamine, triethylamine, triethanolamine, tetramethylammonium hydroxide or the like. The base concentration in those aqueous solutions preferably falls between 0.1 and 10% by weight.

If desired, the developer may additionally contain any of alcohols and surfactants. The amount of the additive preferably falls between 0.01 and 10 parts by weight, more preferably between 0.1 and 5 parts by weight, relative to 100 parts by weight of the developer.

In the next heating step, the pattern formed in the previous step is heated preferably at a temperature falling between 150 and 450° C., whereby it is formed into a relief pattern of a heat-resistant polyimide having imido rings and any other cyclic groups.

The photosensitive polymer composition of the invention may be used in electronic parts such as semiconductor devices, multi-layered interconnection boards, etc. Concretely, it may be used for forming surface-protecting films and interlayer insulating films in semiconductor devices, or for forming interlayer insulating films in multi-layered interconnection boards, etc.

The semiconductor devices of the invention are not specifically defined so far as they have surface-protecting films or interlayer insulating films made from the composition, and may have various structures.

One example of the process for fabricating the semiconductor device of the invention is mentioned below.

FIG. 1A to FIG. 1E show a process for fabricating a semiconductor device having a multi-layered interconnection structure. As illustrated, the semiconductor substrate 1 of, for example, Si or the like which has a circuit element thereon is coated with a protective film 2 of, for example, silicon oxide or the like, except for the predetermined part of the circuit element, and a first conductor layer 3 is formed on the exposed circuit element. The semiconductor substrate is coated with a film 4 of, for example, a polyimide resin or the like that acts as an interlayer insulating film, according to a spin-coating method or the like (step of FIG. 1A).

Figure 1B:
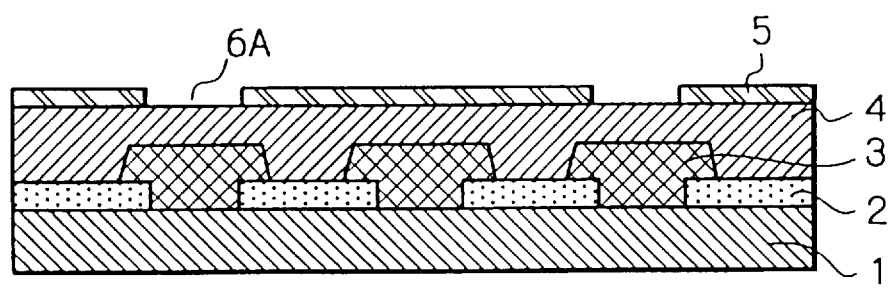
Figure 1C:
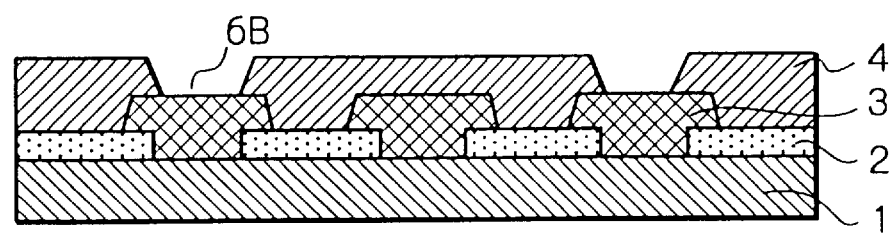

Next, a rubber chloride-based or phenol-novolak-based, photosensitive resin layer 5 is formed on the interlayer insulating film 4 according to a spin-coating method, and windows 6A are formed, through which a predetermined part of the interlayer insulating film 4 is exposed outside, according to a known photo-engraving technique (step of FIG. 1B).

The interlayer insulating film 4 below each window 6A is selectively etched according to a dry etching method for which is used oxygen, carbon tetrafluoride or the like vapor, to give windows 6B. Next, the photosensitive resin layer 5 is completely removed with an etching solution capable of etching the photosensitive resin layer 5 only, but not etching the first conductor layer 3 exposed outside through the windows 6B (step of FIG. 1C).

Figure 1D:
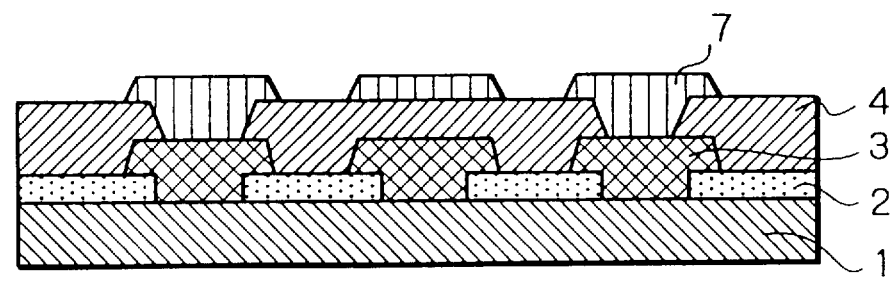

Next, according to a known photo-engraving technique, a second conductor layer 7 is formed, which is completely electrically connected with the first conductor layer 3 (step of FIG. 1D).

For forming a multi-layered interconnection structure having 3 or more layers, the steps illustrated are repeated for each layer.

Figure 1E:
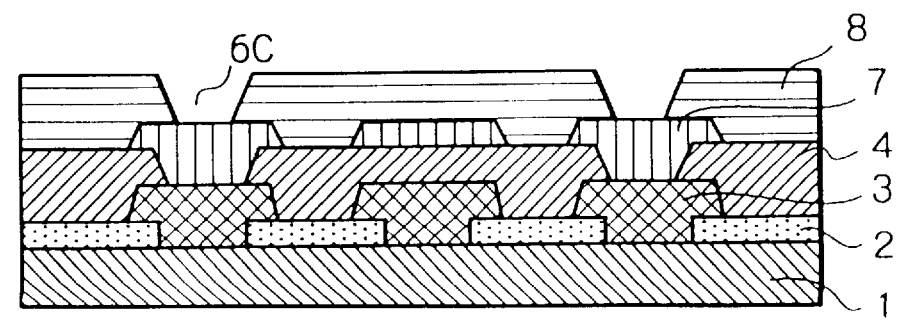

Next, a surface-protecting film 8 is formed (step of FIG. 1E). In this example illustrated, the surface-protecting film is formed according to a spin-coating method, in which the photosensitive polymer composition of the invention is applied onto the wafer and dried thereon, then this is exposed to light via a mask having a pattern for windows 6C to be formed in predetermined parts, and thereafter developed with an aqueous alkaline solution to give a predetermined pattern, and the pattern is then heated to be of a polyimide film. The polyimide film protects the conductor layer from external stress, α-rays and others, and the semiconductor device thus fabricated has good reliability.

In the example illustrated, the interlayer insulating film may also be formed from the photosensitive polymer composition of the invention.

The invention is described in more detail with reference to the following Examples, which, however, are not intended to restrict the scope of the invention.

EXAMPLE 1

17.37 g (0.056 mols) of 3,3',4,4'-diphenylether-tetracarboxylic acid dianhydride, 8.30 g (0.112 mols) of n-butyl alcohol, 0.28 g (0.0028 mols) of triethylamine, and 47.7 g of N-methylpyrrolidone (NMP) were put into a 0.3-liter flask equipped with a stirrer and a thermometer, and stirred and reacted therein at room temperature for 8 hours to obtain an NMP solution (α) of di-n-butyl 3,3',4,4'-diphenylether-tetracarboxylate.

On the other hand, 5.23 g (0.024 mols) of pyromellitic acid dianhydride, 1.54 g (0.048 mols) of methyl alcohol, 0.12 g (0.0012 mols) of triethylamine, and 12.6 g of NMP were put into a 0.3-liter flask equipped with a stirrer and a thermometer, and stirred and reacted therein at room temperature for 4 hours to obtain an NMP solution (β) of dimethyl pyromellitate.

Next, the NMP solution (β) of dimethyl pyromellitate was added to the NMP solution (α) of di-n-butyl 3,3',4,4'-diphenylether-tetracarboxylate, and the flask containing them was cooled to 0° C., to which was dropwise added 17.13 g (0.144 mols) of thionyl chloride, and reacted therewith for 1 hour to obtain a mixed solution (γ) of di-n-butyl 3,3',4,4'-diphenylether-tetracarboxylate dichloride and dimethyl pyromellitate dichloride.

On the other hand, 105 g of N-methylpyrrolidone was put into a 0.5-liter flask equipped with a stirrer and a thermometer, to which was added 26.37 g (0.072 mols) of 2,2-bis(3-amino-4-hydroxyphenyl)hexafluoropropane, and dissolved with stirring. Next, 22.78 g (0.288 mols) of pyridine was added thereto, and thereafter the mixed solution (γ) of di-n-butyl 3,3',4,4'-diphenylether-tetracarboxylate dichloride and dimethyl pyromellitate dichloride was dropwise added thereto over a period of 20 minutes with the temperature in the flask being kept at 0 to 5° C., and then further stirred for 1 hour at a temperature of 30° C. The resulting solution was poured into 3 liters of water, and the precipitate thus formed was collected, washed and then dried under reduced pressure to give a polyamidate (δ).

15.00 g of the polyamidate (δ), 2.25 g of an orthoquinonediazide compound as prepared by reacting tris(4-hydroxyphenyl)methane and 1,2-naphthoquinone-2-diazido-4-sulfonyl chloride in a ratio by mol of 1/2.9, 1.5 g of bis (3-amino-4-hydroxyphenyl)hexafluoropropane, and 0.30 g of a methanol solution of 50% ureidopropyltriethoxysilane were dissolved in 24.47 g of N-methylpyrrolidone with stirring. The resulting solution was filtered under pressure through a 3 μm-Teflon filter to obtain a photosensitive polymer composition. The orthoquinonediazide compound prepared as above had the following structure.

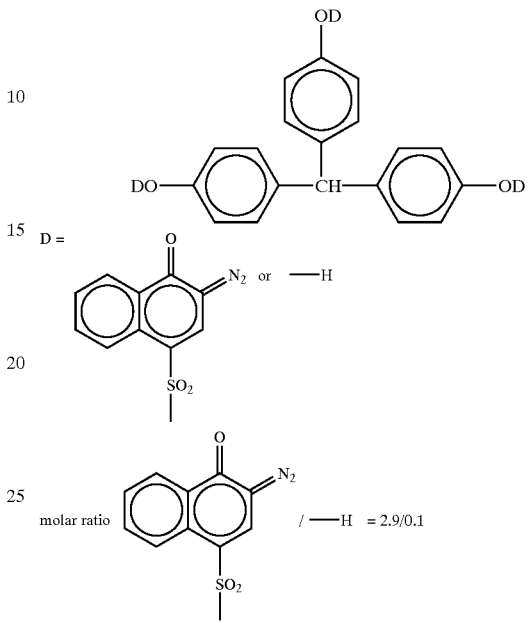

The thus-obtained photosensitive polymer composition was applied onto a silicon wafer through spin-coating, using a spinner, and then heated and dried on a hot plate at 110° C. for 3 minutes to form a 7.5 μm film on the wafer. The film was then exposed to i-lines of from 100 to 500 mJ/cm² via a reticle, using an exposing device, i-line stepper (from Hitachi, Ltd.). Next, this was developed with a developer, aqueous solution of 2.38 wt. % tetramethylammonium hydroxide for 20 seconds, using a paddle, and then rinsed with pure water to form a pattern. From the pattern observation, it was known that the suitable amount of exposure in this case is 300 mJ/cm². Through that exposure, the pattern formed had a good profile. The film retentiveness in the non-exposed area was 79%. The pattern was heated in a nitrogen atmosphere at 350° C. for 1 hour. The relief pattern of the polyimide film thus formed had a good profile.

EXAMPLE 2

15.00 g of the polyamidate (δ) as prepared in Example 1, 2.25 g of an orthoquinonediazide compound as prepared by reacting tris(4-hydroxyphenyl)methane and 1,2-naphthoquinone-2-diazido-4-sulfonyl chloride in a ratio by mol of 1/2.9, 0.15 g of diphenyliodonium nitrate, 1.5 g of 2,2-bis(3-amino-4-hydroxyphenyl)hexafluoropropane, and 0.30 g of a methanol solution of 50% ureidopropyltriethoxysilane were dissolved in 23.46 g of N-methylpyrrolidone with stirring. The resulting solution was filtered under pressure through a 3 μm-Teflon filter to obtain a photosensitive polymer composition.

The thus-obtained photosensitive polymer composition was applied onto a silicon wafer through spin-coating, using a spinner, and then heated and dried on a hot plate at 110° C. for 3 minutes to form a 7.5 μm film on the wafer. The film was then exposed to i-lines of from 100 to 500 mJ/cm² via a reticle, using an exposing device, i-line stepper (from Hitachi, Ltd.). Next, this was developed with a developer, aqueous solution of 2.38 wt. % tetramethylammonium hydroxide for 70 seconds, using a paddle, and then rinsed with pure water to form a pattern. From the pattern observation, it was known that the suitable amount of exposure in this case is 150 mJ/cm$^2$. Through that exposure, the pattern formed had a good profile. The film retentiveness in the non-exposed area was 81%. The patters thus formed had a good profile. The pattern was heated in a nitrogen atmosphere at 350° C. for 1 hour. The relief pattern of the polyimide film thus formed had a good profile.

EXAMPLE 3

48.8 g of N-methylpyrrolidone was put into a 0.5-liter flask equipped with a stirrer and a thermometer, to which were added 5.84 g (0.0384 mols) of 3,5-diaminobenzoic acid and 6.36 g (0.0256 mols) of 4,4'-diaminodiphenyl sulfone, and dissolved with stirring. Next, 22.78 g (0.288 mols) of pyridine was added thereto, and thereafter the mixed solution (γ') of di-n-butyl 3,3',4,4'-diphenylether-tetracarboxylate dichloride and dimethyl pyromellitate dichloride that had been prepared in the same manner as in Example 1 was dropwise added thereto over a period of 20 minutes with the temperature in the flask being kept at 0 to 5° C., and then further stirred for 1 hour at a temperature of 30° C. The resulting solution was poured into 3 liters of water, and the precipitate thus formed was collected, washed and then dried under reduced pressure to give a polyamidate (ε).

15.00 g of the polyamidate (ε), 2.25 g of an orthoquinonediazide compound as prepared by reacting tris(4-hydroxyphenyl)methane and 1,2-naphthoquinone-2-diazido-4-sulfonyl chloride in a ratio by mol of 1/2.9, 1.50 g of tris (4-hydroxyphenyl)methane, 0.15 g of diphenyliodonium nitrate, and 0.30 g of a methanol solution of 50% ureidopropyltriethoxysilane were dissolved in 24.47 g of N-methylpyrrolidone with stirring. The resulting solution was filtered under pressure through a 3 μm-Teflon filter to obtain a photosensitive polymer composition.

The thus-obtained photosensitive polymer composition was applied onto a silicon wafer through spin-coating, using a spinner, and then heated and dried on a hot plate at 110° C. for 3 minutes to form a 7.5 μm film on the wafer. The film was then exposed to i-lines of from 100 to 500 mJ/cm$^2$ via a reticle, using an exposing device, i-line stepper (from Hitachi, Ltd.). Next, this was developed with a developer, aqueous solution of 2.38 wt. % tetramethylammonium hydroxide for 70 seconds, using a paddle, and then rinsed with pure water to form a pattern. From the pattern observation, it was known that the suitable amount of exposure in this case is 250 mJ/cm$^2$. Through that exposure, the pattern formed had a good profile. The film retentiveness in the non-exposed area was 85%. The pattern was heated in a nitrogen atmosphere at 350° C. for 1 hour. The relief pattern of the polyimide film thus formed had a good profile.

EXAMPLE 4

196 g of N-methyl-2-pyrrolidone and 48 g of xylene were put into a 0.5-liter flask equipped with a stirrer, a thermometer and a Dimroth condenser, to which was added 32.97 g (0.09 mols) of 2,2-bis(3-amino-4-hydroxyphenyl) hexafluoropropane, and stirred with stirring. Next, 35.82 g (0.10 mols) of 3,3',4,4'-biphenylsulfone-tetracarboxylic acid dianhydride was added thereto, and stirred for 3 hours to obtain a polyamidic acid solution.

Next, a water meter was fitted to the flask, and the solution in the flask was heated at 160° C. for 2 hours, with water formed through imidation being removed through azeotropic distillation along with xylene. After cooled, the resulting solution was poured into 3 liters of water, and the precipitate thus formed was collected, washed and then dried under reduced pressure to give a polyimide (ξ).

15.00 g of the polyimide (ξ), 2.25 g of an orthoquinonediazide compound as prepared by reacting tris(4-hydroxyphenyl)methane and 1,2-naphthoquinone-2-diazido-4-sulfonyl chloride in a ratio by mol of 1/2.9, 2.00 g of bis(2-hydroxy-5-methylphenyl)methane, 0.10 g of diphenylurea, and 0.30 g of a methanol solution of 50% ureidopropyltriethoxysilane were dissolved in 53.18 g of N-methylpyrrolidone with stirring. The resulting solution was filtered under pressure through a 3 μm-Teflon filter to obtain a photosensitive polymer composition.

The thus-obtained photosensitive polymer composition was applied onto a silicon wafer through spin-coating, using a spinner, and then heated and dried on a hot plate at 110° C. for 3 minutes to form a 6.3 μm film on the wafer. The film was then exposed to i-lines of from 100 to 500 mJ/cm$^2$ via a reticle, using an exposing device, i-line stepper (from Hitachi, Ltd.). Next, this was developed with a developer, aqueous solution of 2.38 wt. % tetramethylammonium hydroxide for 100 seconds, using a paddle, and then rinsed with pure water to form a pattern. From the pattern observation, it was known that the suitable amount of exposure in this case is 300 mJ/cm$^2$. Through that exposure, the pattern formed had a good profile. The film retentiveness in the non-exposed area was 86%. The pattern was heated in a nitrogen atmosphere at 350° C. for 1 hour. The relief pattern of the polyimide film thus formed had a good profile.

COMPARATIVE EXAMPLE 1

15.00 g of the polyamidate (δ) as prepared in Example 1, 2.25 g of an orthoquinonediazide compound as prepared by reacting tris(4-hydroxyphenyl)methane and 1,2-naphthoquinone-2-diazido-4-sulfonyl chloride in a ratio by mol of 1/2.9, and 0.30 g of a methanol solution of 50% ureidopropyltriethoxysilane were dissolved in 23.00 g of N-methylpyrrolidone with stirring. The resulting solution was filtered under pressure through a 3 μm-Teflon filter to obtain a photosensitive polymer composition.

The thus-obtained photosensitive polymer composition was applied onto a silicon wafer through spin-coating, using a spinner, and then heated and dried on a hot plate at 105° C. for 3 minutes to form a 7.5 μm film on the wafer. The film was then exposed to i-lines of from 100 to 500 mJ/cm$^2$ via a reticle, using an exposing device, i-line stepper (from Hitachi, Ltd.). Next, this was developed with a developer, aqueous solution of 2.38 wt. % tetramethylammonium hydroxide for 60 seconds, using a paddle, and then rinsed with pure water to form a pattern. From the pattern observation, it was known that the suitable amount of exposure in this case is 350 mJ/cm$^2$. The film retentiveness in the non-exposed area was 81%.

COMPARATIVE EXAMPLE 2

15.00 g of the polyamidate (ε) as prepared in Example 3, 2.25 g of an orthoquinonediazide compound as prepared by reacting tris(4-hydroxyphenyl)methane and 1,2-naphthoquinone-2-diazido-4-sulfonyl chloride in a ratio by mol of 1/2.9, and 0.30 g of a methanol solution of 50% ureidopropyltriethoxysilane were dissolved in 23.00 g of N-methylpyrrolidone with stirring. The resulting solution was filtered under pressure through a 3 μm-Teflon filter to obtain a photosensitive polymer composition.

The thus-obtained photosensitive polymer composition was applied onto a silicon wafer through spin-coating, using a spinner, and then heated and dried on a hot plate at 105° C. for 3 minutes to form a 7.5 μm film on the wafer. The film was then exposed to i-lines of from 100 to 500 mJ/cm² via a reticle, using an exposing device, i-line stepper (from Hitachi, Ltd.). Next, this was developed with a developer, aqueous solution of 2.38 wt. % tetramethylammonium hydroxide for 45 seconds, using a paddle, and then rinsed with pure water to form a pattern. From the pattern observation, it was known that the suitable amount of exposure in this case is 500 mJ/cm². The film retentiveness in the non-exposed area was 83%.

COMPARATIVE EXAMPLE 3

15.00 g of the polyamidate (ξ) as prepared in Example 4, 2.25 g of an orthoquinonediazide compound as prepared by reacting tris(4-hydroxyphenyl)methane and 1,2-naphthoquinone-2-diazido-4-sulfonyl chloride in a ratio by mol of 1/2.9, and 0.30 g of a methanol solution of 50% ureidopropyltriethoxysilane were dissolved in 53.18 g of N-methylpyrrolidone with stirring. The resulting solution was filtered under pressure through a 3 μm-Teflon filter to obtain a photosensitive polymer composition.

The thus-obtained photosensitive polymer composition was applied onto a silicon wafer through spin-coating, using a spinner, and then heated and dried on a hot plate at 105° C. for 3 minutes to form a 7.5 μm film on the wafer. The film was then exposed to i-lines of from 300 to 700 mJ/cm² via a reticle, using an exposing device, i-line stepper (from Hitachi, Ltd.). Next, this was developed with a developer, aqueous solution of 2.38 wt. % tetramethylammonium hydroxide for 190 seconds, using a paddle, and then rinsed with pure water to form a pattern. From the pattern observation, it was known that the suitable amount of exposure in this case is 550 mJ/cm². The film retentiveness in the non-exposed area was 88%.

EXAMPLE 5

19.54 g (0.063 mols) of 3,3',4,4'-diphenylether-tetracarboxylic acid dianhydride, 9.34 g (0.126 mols) of n-butyl alcohol, 0.29 g (0.0019 mols) of 1,8-diazabicyclo[5.4.0]-7-undecene and 53.6 g of NMP were put into a 0.3-liter flask equipped with a stirrer and a thermometer, and stirred and reacted therein at 60° C. for 6 hours to obtain an NMP solution (η) of di-n-butyl 3,3',4,4'-diphenylether-tetracarboxylate.

On the other hand, 5.89 g (0.027 mols) of pyromellitic acid dianhydride, 4.0 g (0.054 mols) of n-butyl alcohol, 0.12 g (0.0008 mols of 1,8-diazabicyclo[5.4.0]-7-undecene, and 25.4 g of NMP were put into a 0.3-liter flask equipped with a stirrer and a thermometer, and stirred and reacted therein at 60° C. for 4 hours to obtain an NMP solution (θ) of di-n-butyl pyromellitate.

Next, the NMP solution (θ) of di-n-butyl pyromellitate was added to the NMP solution (η) of di-n-butyl 3,3',4,4'-diphenylether-tetracarboxylate, and the flask containing them was cooled to 0° C., to which was dropwise added 20.56 g (0.173 mols) of thionyl chloride, and reacted therewith for 1 hour to obtain a mixed solution (ι) of di-n-butyl 3,3',4,4'-diphenylether-tetracarboxylate dichloride and di-n-butyl pyromellitate dichloride.

On the other hand, 127 g of N-methylpyrrolidone was put into a 0.5-liter flask equipped with a stirrer and a thermometer, to which was added 31.65 g (0.086 mols) of 2,2-bis(3-amino-4-hydroxyphenyl)hexafluoropropane, and dissolved with stirring. Next, 27.34 g (0.346 mols) of pyridine was added thereto, and thereafter the mixed solution (ι) of di-n-butyl 3,3',4,4'-diphenylether-tetracarboxylate dichloride and di-n-butyl pyromellitate dichloride was dropwise added thereto over a period of 20 minutes with the temperature in the flask being kept at 0 to 5° C., and then further stirred for 1 hour at a temperature of 30° C. The resulting solution was poured into 3 liters of water, and the precipitate thus formed was collected, washed and then dried under reduced pressure to give 63 g of a polyamidate.

Measured through gel permeation chromatography using a calibration curve of a standard substance of polystyrene, the polyamidate was found to have a weight-average molecular weight of 22,500. For the measurement, used was a GPC device from Hitachi, Ltd., in which two columns of GL-S30OMPT-5 (from Hitachi Chemical Company, Ltd.) were connected in series. The eluent used was THF/DMF=1/1, the flow rate was 1 ml/min, and the wavelength for detection was 310 nm.

15.00 g of the polyamidate, 2.25 g of an orthoquinonediazide compound as prepared by reacting tris(4-hydroxyphenyl)methane and 1,2-naphthoquinone-2-diazido-4-sulfonyl chloride in a ratio by mol of 1/2.9, 1.5 g of 3,3'-methylenebis(2-hydroxy-5-methylbenzenemethanol), and 0.30 g of a methanol solution of 50% ureidopropyltriethoxysilane were dissolved in 24.47 g of N-methylpyrrolidone with stirring. The resulting solution was filtered under pressure through a 3 μm-Teflon filter to obtain a photosensitive polymer composition.

The thus-obtained photosensitive polymer composition was applied onto a silicon wafer through spin-coating, using a spinner, and then heated and dried on a hot plate at 110° C. for 3 minutes to form a 7.5 μm film on the wafer. The film was then exposed to i-lines of from 100 to 500 mJ/cm² via a reticle, using an exposing device, i-line stepper (from Hitachi, Ltd.). Next, this was developed with a developer, aqueous solution of 2.38 wt. % tetramethylammonium hydroxide for 45 seconds, using a paddle, and then rinsed with pure water to form a pattern. From the pattern observation, it was known that the suitable amount of exposure in this case is 300 mJ/cm². Through that exposure, the pattern formed had a good profile. The film retentiveness in the non-exposed area was 82%. The pattern was heated in a nitrogen atmosphere at 350° C. for 1 hour to obtain a relief pattern of a polyimide film. While being cured, the polyimide film did not fuse at all, and the relief pattern of the polyimide film thus formed had a good profile.

EXAMPLE 6

15.00 g of the polyamidate as prepared in Example 5, 2.25 g of an orthoquinonediazide compound as prepared by reacting tris(4-hydroxyphenyl)methane and 1,2-naphthoquinone-2-diazido-4-sulfonyl chloride in a ratio by mol of 1/2.9, 0.15 g of diphenyliodonium nitrate, 1.50 g of 3,3'-methylenebis(2-hydroxy-5-methylbenzenemethanol), and 0.30 g of a methanol solution of 50% ureidopropyltriethoxysilane were dissolved in 23.46 g of N-methylpyrrolidone with stirring. The resulting solution was filtered under pressure through a 3 μm-Teflon filter to obtain a photosensitive polymer composition.

The thus-obtained photosensitive polymer composition was applied onto a silicon wafer through spin-coating, using a spinner, and then heated and dried on a hot plate at 110° C. for 3 minutes to form a 7.5 μm film on the wafer. The film was then exposed to i-lines of from 100 to 500 mJ/cm² via a reticle, using an exposing device, i-line stepper (from Hitachi, Ltd.). Next, this was developed with a developer, aqueous solution of 2.38 wt. % tetramethylammonium hydroxide for 120 seconds, using a paddle, and then rinsed with pure water to form a pattern. From the pattern observation, it was known that the suitable amount of exposure in this case is 200mJ/cm$^2$. Through that exposure, the pattern formed had a good profile. The film retentiveness in the non-exposed area was 83%. The pattern was heated in a nitrogen atmosphere at 350° C. for 1 hour to obtain a relief pattern of a polyimide film. While being cured, the polyimide film did not fuse at all, and the relief pattern of the polyimide film thus formed had a good profile.

COMPARATIVE EXAMPLE 4

15.00 g of the polyamidate as prepared in Example 5, 2.25 g of an orthoquinonediazide compound as prepared by reacting tris(4-hydroxyphenyl)methane and 1,2-naphthoquinone-2-diazido-4-sulfonyl chloride in a ratio by mol of 1/2.9, and 0.30 g of a methanol solution of 50% ureidopropyltriethoxysilane were dissolved in 23.00 g of N-methylpyrrolidone with stirring. The resulting solution was filtered under pressure through a 3 μm-Teflon filter to obtain a photosensitive polymer composition.

The thus-obtained photosensitive polymer composition was applied onto a silicon wafer through spin-coating, using a spinner, and then heated and dried on a hot plate at 105° C. for 3 minutes to form a 7.5 μm film on the wafer. The film was then exposed to i-lines of from 100 to 500 mJ/cm$^2$ via a reticle, using an exposing device, i-line stepper (from Hitachi, Ltd.). Next, this was developed with a developer, aqueous solution of 2.38 wt. % tetramethylammonium hydroxide for 70 seconds, using a paddle, and then rinsed with pure water to form a pattern. From the pattern observation, it was known that the suitable amount of exposure in this case is 400 mJ/cm$^2$. The film retentiveness in the non-exposed area was 83%.

EXAMPLE 7

15.00 g of the polyamidate as prepared in Example 5, 2.25 g of an orthoquinonediazide compound as prepared by reacting tris(4-hydroxyphenyl)methane and 1,2-naphthoquinone-2-diazido-4-sulfonyl chloride in a ratio by mol of 1/2.9, 1.5 g of 2,2'-methylenebis(4-methylphenol), and 0.30 g of a methanol solution of 50% ureidopropyltriethoxysilane were dissolved in 23.00 g of N-methylpyrrolidone with stirring. The resulting solution was filtered under pressure through a 3 μm-Teflon filter to obtain a photosensitive polymer composition.

The thus-obtained photosensitive polymer composition was applied onto a silicon wafer through spin-coating, using a spinner, and then heated and dried on a hot plate at 105° C. for 3 minutes to form a 7.5 μm film on the wafer. The film was then exposed to i-lines of from 100 to 500 mJ/cm$^2$ via a reticle, using an exposing device, i-line stepper (from Hitachi, Ltd.). Next, this was developed with a developer, aqueous solution of 2.38 wt. % tetramethylammonium hydroxide for 45 seconds, using a paddle, and then rinsed with pure water to form a pattern. From the pattern observation, it was known that the suitable amount of exposure in this case is 300 mJ/cm$^2$. Through that exposure, the pattern formed had a good profile. The film retentiveness in the non-exposed area was 81%.

EXAMPLE 8

15.00 g of the polyamidate (δ) as prepared in Example 1, 2.25 g of an orthoquinonediazide compound as prepared by reacting tris(4-hydroxyphenyl)methane and 1,2-naphthoquinone-2-diazido-4-sulfonyl chloride in a ratio by mol of 1/2.9, 0.15 g of 4-methoxydiphenyliodonium trifluoromethanesulfonate, 1.5 g of 2,2-bis(3-amino-4-hydroxyphenyl)hexafluoropropane, and 0.30 g of a methanol solution of 50% ureidopropyltriethoxysilane were dissolved in 23.46 g of N-methylpyrrolidone with stirring. The resulting solution was filtered under pressure through a 3 μm-Teflon filter to obtain a photosensitive polymer composition.

The thus-obtained photosensitive polymer composition was applied onto a silicon wafer through spin-coating, using a spinner, and then heated and dried on a hot plate at 110° C. for 3 minutes to form a 7.6 μm film on the wafer. The film was then exposed to i-lines of from 100 to 500 mJ/cm$^2$ via a reticle, using an exposing device, i-line stepper (from Hitachi, Ltd.). Next, this was developed with a developer, aqueous solution of 2.38 wt. % tetramethylammonium hydroxide for 50 seconds, using a paddle, and then rinsed with pure water to form a pattern. From the pattern observation, it was known that the suitable amount of exposure in this case is 200 mJ/cm$^2$. Through that exposure, the pattern formed had a good profile. The film retentiveness in the non-exposed area was 80%. The pattern was heated in a nitrogen atmosphere at 350° C. for 1 hour, and the relief pattern of the polyimide film thus formed had a good profile.

EXAMPLE 9

15.00 g of the polyamidate (δ) as prepared in Example 1, 2.25 g of an orthoquinonediazide compound as prepared by reacting tris(4-hydroxyphenyl)methane and 1,2-naphthoquinone-2-diazido-4-sulfonyl chloride in a ratio by mol of 1/2.9, 0.15 g of tetramethylammonium chloride, 1.5 g of 2,2-bis(3-amino-4-hydroxyphenyl)hexafluoropropane, and 0.30 g of a methanol solution of 50% ureidopropyltriethoxysilane were dissolved in 23.46 g of N-methylpyrrolidone with stirring. The resulting solution was filtered under pressure through a 3 μm-Teflon filter to obtain a photosensitive polymer composition.

The thus-obtained photosensitive polymer composition was applied onto a silicon wafer through spin-coating, using a spinner, and then heated and dried on a hot plate at 110° C. for 3 minutes to form a 7.4 μm film on the wafer. The film was then exposed to i-lines of from 100 to 500 mJ/cm$^2$ via a reticle, using an exposing device, i-line stepper (from Hitachi, Ltd.). Next, this was developed with a developer, aqueous solution of 2.38 wt. % tetramethylammonium hydroxide for 40 seconds, using a paddle, and then rinsed with pure water to form a pattern. From the pattern observation, it was known that the suitable amount of exposure in this case is 150 mJ/cm$^2$. Through that exposure, the pattern formed had a good profile. The film retentiveness in the non-exposed area was 82%. The pattern was heated in a nitrogen atmosphere at 350° C. for 1 hour, and the relief pattern of the polyimide film thus formed had a good profile.

As has been described in detail hereinabove, the photosensitive polymer composition of the invention is of a positive type and is developable with an aqueous alkaline solution to give a relief pattern having high heat resistance. The composition has high sensitivity, and the development time for it is short.

Specifically, the photosensitive polymer composition of the invention have the advantages of high sensitivity, high resolution, good patternability to give relief patterns having good profiles and short development time.

According to the method for forming relief patterns of the invention, the high-sensitivity composition is used to give high-resolution relief patterns having good profiles.

The electronic parts of the invention have fine relief patterns having good profiles, in which the relief patterns serve as a surface-protecting film and/or an interlayer insulating film, and the reliability of the electronic parts is high.

While the invention has been described in detail and with reference to specific embodiments thereof, it will be apparent to one skilled in the art that various changes and modifications can be made therein without departing from the spirit and scope thereof.

What is claimed is:

1. A photosensitive polymer composition, comprising:
   (a) a polyamidate which is soluble in an aqueous alkaline solution and has a weight average molecular weight of 3,000 to 200,000;
   (b) a compound capable of generating an acid when exposed to light; and
   (c) a compound having a phenolic hydroxyl group and having a molecular weight of at most 1,500.

2. The photosensitive polymer composition as claimed in claim 1, wherein component (a) is a polyamidate having repetitive units of general formula (I):

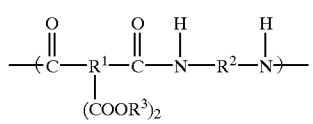

(I)

wherein $R^1$ represents a tetravalent organic group; $R^2$ represents a divalent organic group having a carboxyl group or a phenolic hydroxyl group; and each $R^3$ independently represents a monovalent organic group.

3. The photosensitive polymer composition as claimed in claim 1, wherein the component (a) has a phenolic hydroxyl group.

4. The photosensitive polymer composition as claimed in claim 1, wherein the component (a) has a carboxyl group.

5. The photosensitive polymer composition as claimed in claim 2, wherein the $R^1$ is a tetracarboxylic acid residue or dianhydride thereof, or residue reactable with a diamine to form a polyimide precursor.

6. The photosensitive polymer composition as claimed in claim 5, wherein the $R^1$ is a tetravalent aromatic or aliphatic group having 4 to 40 carbon atoms.

7. The photosensitive polymer composition as claimed in claim 6, wherein the $R^1$ is a tetravalent aromatic or aliphatic group having 6 to 40 carbon atoms.

8. The photosensitive polymer composition as claimed in claim 2, wherein $R^2$ is a residue derived from a diamine compound having a carboxyl group or a phenolic hydroxyl group by removing the amino groups from the compound, said compound being reactable with a tetracarboxylic acid, or with a dianhydride or derivative of tetracarboxylic acid to form a polyimide precursor.

9. The photosensitive polymer composition as claimed in claim 8, where $R^2$ is an aromatic or aliphatic group having from 2 to 40 carbon atoms.

10. The photosensitive polymer composition as claimed in claim 2, wherein $R^2$ represents a divalent organic group having a carboxyl group.

11. The photosensitive polymer composition as claimed in claim 2, wherein two $R^3$'s each independently represent an aliphatic or aromatic hydrocarbon group having from 1 to 20 carbon atoms.

12. The photosensitive polymer composition as claimed in claim 1, further comprising:
   (d) a dissolution retardant for the component (a) in an aqueous alkaline solution.

13. The photosensitive polymer composition as claimed in claim 1, wherein the component (b) is an o-quinonediazide compound.

14. A photosensitive polymer composition, comprising:
   (a) a polyamidate which is soluble in an aqueous alkaline solution and has a weight average molecular weight of 3,000 to 200,000;
   (b) a compound capable of generating an acid when exposed to light; and
   (c) a compound having a phenolic hydroxyl group and having a molecular weight of at most 1,500;
wherein component (c) is a compound of a general formula (II):

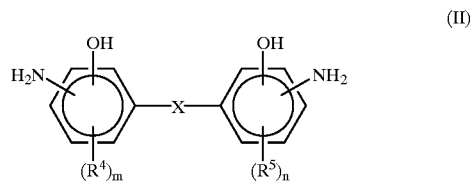

(II)

wherein X represents a single bond or a divalent group; $R^4$ and $R^5$ each independently represent an alkyl group; and m and n each independently represent an integer of from 0 to 3.

15. The photosensitive polymer composition as claimed in claim 14, wherein X in the compound of formula (II) is selected from the following groups:

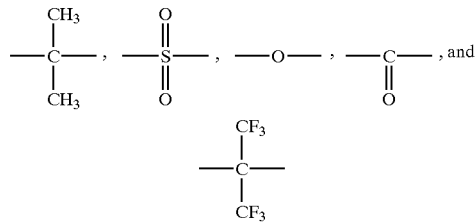

16. The photosensitive polymer composition as claimed in claim 15, wherein the compound of formula (II) is 2,2-bis(3-amino-4-hydroxyphenyl)hexafluoropropane.

17. The photosensitive polymer composition as claimed in claim 1, wherein the component (c) is a compound of a general formula (III):

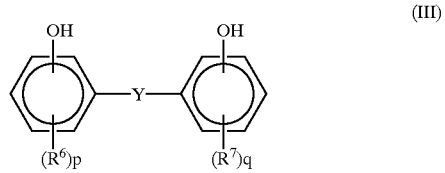

(III)

wherein Y represents a single bond or a divalent group; $R^6$ and $R^7$ each independently represent an alkyl group; and p and q each independently represent an integer of from 0 to 3.

18. The photosensitive polymer composition as claimed in claim 17, wherein Y is a divalent organic group having one or more aromatic rings.

19. A photosensitive polymer composition, comprising:
   (a) a polyamidate which is soluble in an aqueous alkaline solution and has a weight average molecular weight of 3,000 to 200,000;

(b) a compound capable of generating an acid when exposed to light; and (c) a compound having a phenolic hydroxyl group and having a molecular weight of at most 1,500;

wherein the component (c) is a compound having a methylol group and a phenolic hydroxyl group.

20. The photosensitive polymer composition as claimed in claim 19, wherein the compound having a methylol group and a phenolic hydroxyl group is represented by a general formula (IV):

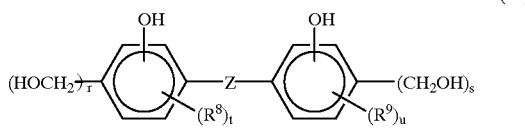

(IV)

wherein Z represents a single bond or a divalent group; $R^8$ and $R^9$ each independently represent an alkyl group or an alkenyl group; r and s each independently represent 1 or 2; and t and u each independently represent an integer of from 0 to 3.

21. The photosensitive polymer composition as claimed in claim 20, wherein Z is a group of:

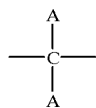

wherein two A's each independently represent a hydrogen atom, or an alkyl group having from 1 to 10 carbon atoms.

22. The photosensitive polymer composition as claimed in claim 21, wherein the compound of formula (IV) is 3,3'-methylenebis(2-hydroxy-5-methylbenzenemethanol).

23. The photosensitive polymer composition as claimed in claim 12, wherein the component (d) is selected from an onium salt, a diaryl compound or a tetraalkylammonium salt.

24. The photosensitive polymer composition as claimed in claim 23, wherein the component (d) is selected from a diaryliodonium salt, a diaryl sulfone compound, a diarylurea compound or a tetramethylammonium halide compound.

25. The photosensitive polymer composition as claimed in claim 24, wherein the component (d) is a diaryliodonium salt of a general formula (V):

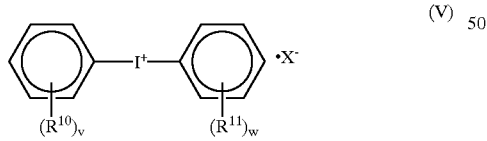

(V)

wherein $R^{10}$ and $R^{11}$ each independently represent a monovalent organic group, and $R^{10}$'s and $R^{11}$'s may be the same or different; v and w each independently represent an integer of from 0 to 5; and $X^-$ represents a counter anion.

26. The photosensitive polymer composition as claimed in claim 1, which contains from 5 to 100 parts by weight of the component (b) and from 1 to 30 parts by weight of the component (c), relative to 100 parts by weight of the component (a).

27. The photosensitive polymer composition as claimed in claim 26, which further contains from 0.01 to 15 parts by weight of the component (d) relative to 100 parts by weight of the component (a).

28. A method for forming relief patterns, which comprises a step of applying the photosensitive polymer composition of claim 1 onto a substrate and drying it thereon, a step of exposing it, a step of developing it, and a step of heating it.

29. The method for forming relief patterns as claimed in claim 28, wherein the light to be used in the exposing step is of i-line.

30. An electronic part having, as a surface-protecting film or an interlayer insulating film, the relief pattern as formed in the method of claim 29.

31. The photosensitive polymer composition as claimed in claim 1, which contains from 5 to 100 parts of weight of the component (b) and from 1 to 20 parts by weight of the component (c), relative to 100 parts by weight of component (a).

32. A photosensitive polymer composition, comprising:

(a) a polyamidate which is soluble in an aqueous alkaline solution and has a weight average molecular weight of 3,000 to 200,000;

(b) a compound capable of generating an acid when exposed to light; and (c) a compound having a phenolic hydroxyl group and having a molecular weight of at most 1,500;

wherein the photosensitive polymer composition contains from 5 to 100 parts by weight of the component (b); from 1 to 20 parts by weight of the component (c), relative to 100 parts by weight of component (a); and from 0.01 to 15 parts by weight of(d), a dissolution retardant for the component (a), relative to 100 parts by weight of the component (a).

33. The photosensitive polymer composition as claimed in claim 1, which contains from 5 to 40 parts by weight of the component (b) and from 1 to 20 parts by weight of the component (c), relative to 100 parts by weight of the component (a).

34. A photosensitive polymer composition, comprising:

(a) a polyamidate which is soluble in an aqueous alkaline solution and has a weight average molecular weight of 3,000 to 200,000;

(b) a compound capable of generating an acid when exposed to light; and (c) a compound having a phenolic hydroxyl group and having a molecular weight of at most 1,500;

wherein the photosensitive polymer composition contains from 5 to 40 parts by weight of the component (b); from 1 to 20 parts by weight of the component (c), relative to 100 parts by weight of the component (a); and from 0.01 to 15 parts by weight of (d), a dissolution retardant for the component (a), relative to 100 parts by weight of the component (a).

* * * * *